United States Patent
Lee et al.

(10) Patent No.: US 8,049,116 B2
(45) Date of Patent: Nov. 1, 2011

(54) CIRCUIT SUBSTRATE AND METHOD FOR FABRICATING INDUCTIVE CIRCUIT

(75) Inventors: Pao-Nan Lee, Pingtung County (TW); Chi-Tsung Chiu, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 679 days.

(21) Appl. No.: 12/175,720

(22) Filed: Jul. 18, 2008

(65) Prior Publication Data

US 2009/0025964 A1 Jan. 29, 2009

(30) Foreign Application Priority Data

Jul. 24, 2007 (TW) ............................... 96126891 A

(51) Int. Cl.
*H05K 1/16* (2006.01)
*H01F 21/00* (2006.01)

(52) U.S. Cl. .......... 174/260; 174/250; 361/761; 29/825; 29/829; 29/847; 336/137; 336/200

(58) Field of Classification Search .................. 174/250, 174/251, 255, 260; 29/825, 829, 847; 336/137, 336/200; 361/761, 763, 765–766

See application file for complete search history.

(56) References Cited

U.S. PATENT DOCUMENTS

| 4,035,695 | A * | 7/1977 | Knutson et al. | 361/782 |
| 4,494,100 | A * | 1/1985 | Stengel et al. | 336/200 |
| 5,239,289 | A * | 8/1993 | Ferraiolo et al. | 336/180 |
| 5,517,756 | A * | 5/1996 | Shirai et al. | 29/847 |
| 6,114,938 | A * | 9/2000 | Iida et al. | 336/200 |
| 6,369,683 | B1 * | 4/2002 | Iida et al. | 336/200 |
| 6,369,684 | B1 * | 4/2002 | Iida et al. | 336/200 |
| 6,498,556 | B2 * | 12/2002 | Iida et al. | 336/200 |
| 6,624,735 | B2 * | 9/2003 | Iida et al. | 336/200 |
| 7,071,806 | B2 * | 7/2006 | Masu et al. | 336/200 |
| 2009/0019692 | A1 * | 1/2009 | Huang et al. | 29/847 |

* cited by examiner

*Primary Examiner* — Robert J Hoffberg
(74) *Attorney, Agent, or Firm* — J.C. Patents

(57) ABSTRACT

A circuit substrate including a laminated layer, an embedded electronic device, at least a circuit structure, and a solder mask layer is provided. The embedded electronic device is disposed within the laminated layer. The circuit structure is disposed on a surface of the laminated layer and is connected between a reference plane and the embedded electronic device. In addition, the solder mask layer is disposed on the surface of the laminated layer and exposes a portion of the circuit structure. The circuit structure has a specific layout by which a circuit trace with an adjustable length can be formed by disconnecting or connecting the exposed portion of the circuit structure.

11 Claims, 10 Drawing Sheets

CIRCUIT SUBSTRATE AND METHOD FOR FABRICATING INDUCTIVE CIRCUIT

CROSS-REFERENCE TO RELATED APPLICATION

This application claims the priority benefit of Taiwan application serial no. 96126891, filed on Jul. 24, 2007. The entirety of the above-mentioned patent application is hereby incorporated by reference herein and made a part of this specification.

BACKGROUND OF THE INVENTION

1. Field of the Invention

The present invention relates to a circuit substrate and a method for fabricating the same. In particular, the present invention relates to a package substrate having a adjustable circuit structure and a method for fabricating said package structure.

2. Description of Related Art

In recent years, electronic devices are frequently installed in a circuit board for improving electrical properties of the electronic devices, which is known as a system-in-package (SIP) structure. The SIP structure is referred to as a system integration package. Namely, the electronic devices are compacted into a single package in which passive devices, memories, electronic connectors, and other embedded devices are included. A variety of manufacturing methods can be applied to the SIP structure made of various materials. As the electronic devices are configured within the circuit board, metal lines (conductive layers) are stacked on the circuit board through performing a build-up method, so as to assemble the circuit board having multiple layers.

Nevertheless, the SIP structure has a relatively complicated structure notwithstanding the fact that the SIP structure can effectively reduce package area and initially integrate the system. Moreover, in comparison with a single chip package, the SIP structure encounters more challenges with respect to its design for heat dissipation and maintenance of electrical reliability. In particular, the SIP structure contains a variety of embedded devices integrated in the circuit board, thus posing a limitation on the circuit layout of the SIP structure. During fabrication of the SIP structure, circuit patterns are not apt to be adjusted, and electrical performance of the entire device is relatively affected. Taking a common embedded band pass filter (BPF) as an example, the circuit acting as an inductor cannot be adjusted in a timely manner, and therefore a frequency shift is prone to occur, exacerbating the band-pass effect and deteriorating performance of the SIP structure.

SUMMARY OF THE INVENTION

The present invention is directed to a circuit substrate with an adjustable circuit layout. Namely, a length of a circuit in the circuit substrate can be adjusted in a timely manner upon actual demands.

The present invention is further directed to a method for fabricating an inductive circuit. Through the method, the inductive circuit with different lengths can be formed, and thereby performance and power gain of an SIP product is promoted.

A circuit substrate including a laminated layer, an embedded electronic device, at least a circuit structure, and a solder mask layer is provided herein to embody the present invention. The embedded electronic device is disposed within the laminated layer. The circuit structure is disposed on a surface of the laminated layer and includes a main line and a plurality of branch lines. The main line includes a first terminal and a second terminal. The first terminal is connected to one of a reference plane and the embedded electronic device, while the second terminal is connected to the other through the branch lines. The solder mask layer is disposed on the surface of the laminated layer. Besides, the solder mask layer has an opening for exposing the branch lines of the circuit structure.

According to an embodiment of the present invention, the solder mask layer further exposes a portion of the main line connected to the branch lines.

According to an embodiment of the present invention, the laminated layer includes a plurality of dielectric layers and at least a conductive layer that is interposed between the two adjacent dielectric layers.

According to an embodiment of the present invention, the reference plane is a ground plane.

According to an embodiment of the present invention, the embedded electronic device and the circuit structure together form a filter.

A method for fabricating an inductive circuit is also provided herein. The method is adapted to a circuit substrate to embody the present invention. The circuit substrate includes a laminated layer, an embedded electronic device, at least a circuit structure, and a solder mask layer. The embedded electronic device is disposed within the laminated layer. The circuit structure is disposed on a surface of the laminated layer and includes a main line and a plurality of branch lines. The main line includes a first terminal and a second terminal. The first terminal is connected to one of a reference plane and the embedded electronic device, while the second terminal is connected to the other through the branch lines. The solder mask layer is disposed on the surface of the laminated layer and includes an opening for exposing the branch lines in the circuit structure. The method for forming the inductive circuit includes first selecting one of the branch lines to divide the main line into a first portion and a second portion. The first portion is interposed between the selected branch line and the first terminal, while the second portion is interposed between the selected branch line and the second terminal. Next, the second portion of the main line and the selected branch line are disconnected, and the other branch lines and the first portion of the main line are disconnected as well, such that the selected branch line and the first portion of the main line together form the inductive circuit.

According to an embodiment of the present invention, the solder mask layer further exposes a portion of the main line connected to the branch lines.

According to an embodiment of the present invention, the reference plane is a ground plane.

According to an embodiment of the present invention, the laminated layer includes a plurality of dielectric layers and at least a conductive layer that is interposed between the two adjacent dielectric layers.

According to an embodiment of the present invention, the embedded electronic device and the circuit structure together form a filter.

According to an embodiment of the present invention, the method of disconnecting the main line and the branch lines may include performing a laser cutting process on the main line and the branch lines through the opening of the solder mask layer. Here, the main line and the branch lines are exposed by said opening.

A circuit substrate including a laminated layer, an embedded electronic device, at least a circuit structure, and a solder mask layer is also provided herein to embody the present invention. The embedded electronic device is disposed within the laminated layer. The circuit structure is disposed on a surface of the laminated layer and includes a main line and a plurality of circuit traces. The main line and the circuit traces are arranged along a trace direction. The trace direction is extended from the embedded electronic device to a reference plane. The main line is connected to one of a reference plane and the embedded electronic device. There exists a first blank area between the two adjacent circuit traces, while there exists a second blank area between each of the circuit traces and the corresponding reference plane or the embedded electronic device. The solder mask layer is disposed on the surface of the laminated layer and has an opening at least exposing the first blank areas and the second blank areas.

According to an embodiment of the present invention, the opening further exposes the circuit traces.

According to an embodiment of the present invention, the laminated layer includes a plurality of dielectric layers and at least a conductive layer that is interposed between the two adjacent dielectric layers.

According to an embodiment of the present invention, the reference plane is a ground plane.

According to an embodiment of the present invention, the embedded electronic device and the circuit structure together form a filter.

According to an embodiment of the present invention, further comprising an inductive circuit formed by conducting the second blank area corresponding to a selected circuit trace of the circuit traces and conducting the first blank areas between the selected circuit trace and the main line.

According to an embodiment of the present invention, the selected circuit trace, the main line, and the other circuit traces interposed between the selected circuit trace and the main line together form the inductive circuit.

According to an embodiment of the present invention, a conductive material filled the first blank areas and the second blank areas through the opening of the solder mask layer to conduct the first blank areas and the second blank areas.

According to an embodiment of the present invention, the conductive material includes a solder material.

To sum up, in the circuit substrate of the present invention and the method for fabricating the inductive circuit, the length of the circuit in the circuit substrate can be adjusted upon the actual demands. As the present invention is applied to the embedded electronic device in the SIP structure, there is a likelihood of adjusting the length of the circuit. For instance, the frequency shift arisen from the embedded BPF can be rectified by applying the present invention, and thereby the band-pass effect can be improved. As such, the performance and yield of the SIP products can be increased. Moreover, the application of the present invention can also be conducive to adjusting resistance or adjusting the length of other circuits.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
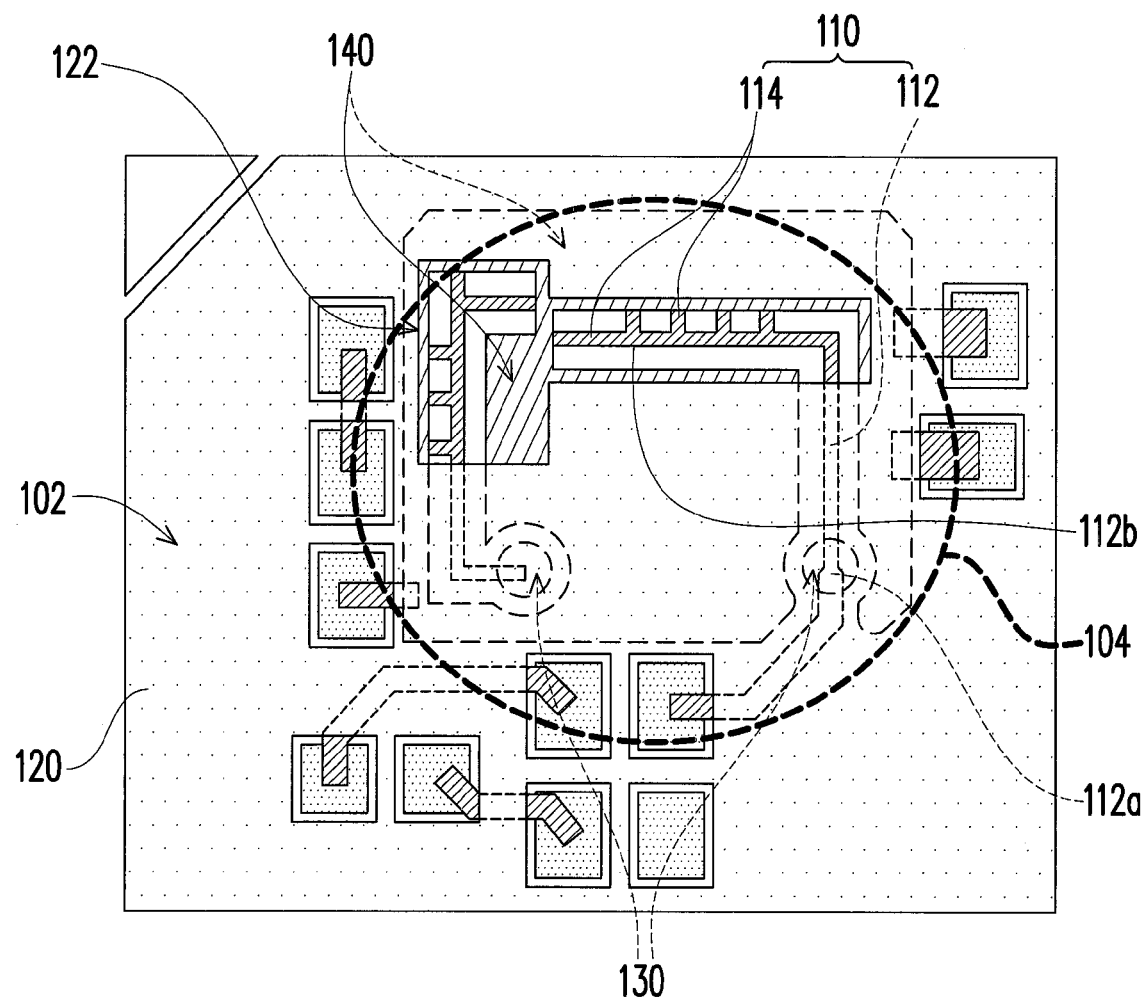
FIG. 1A is a schematic view depicting a circuit substrate in which an inductive circuit has not yet been formed according to a first embodiment of the present invention.
Figure 1B:
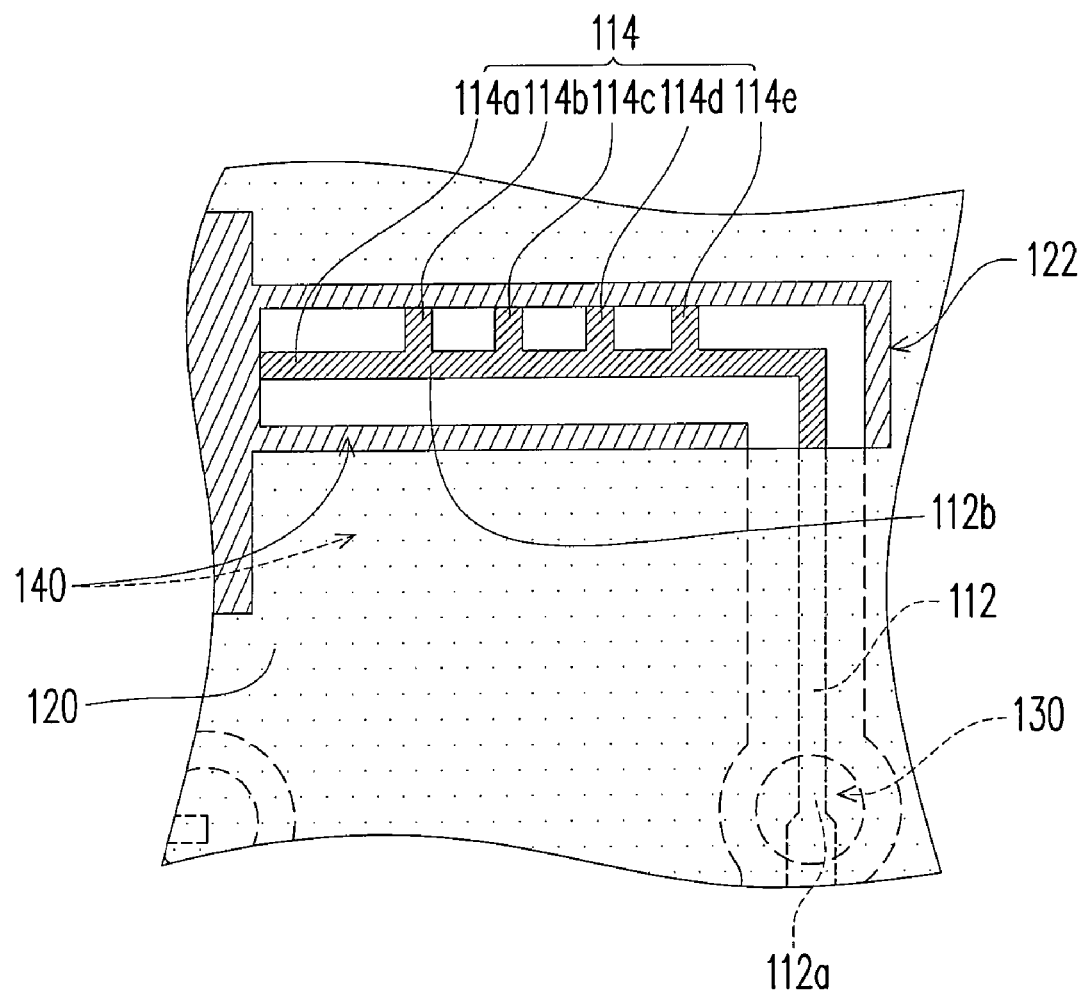
FIG. 1B is a schematic view depicting a portion of the view provided in FIG. 1A.
Figure 1C:
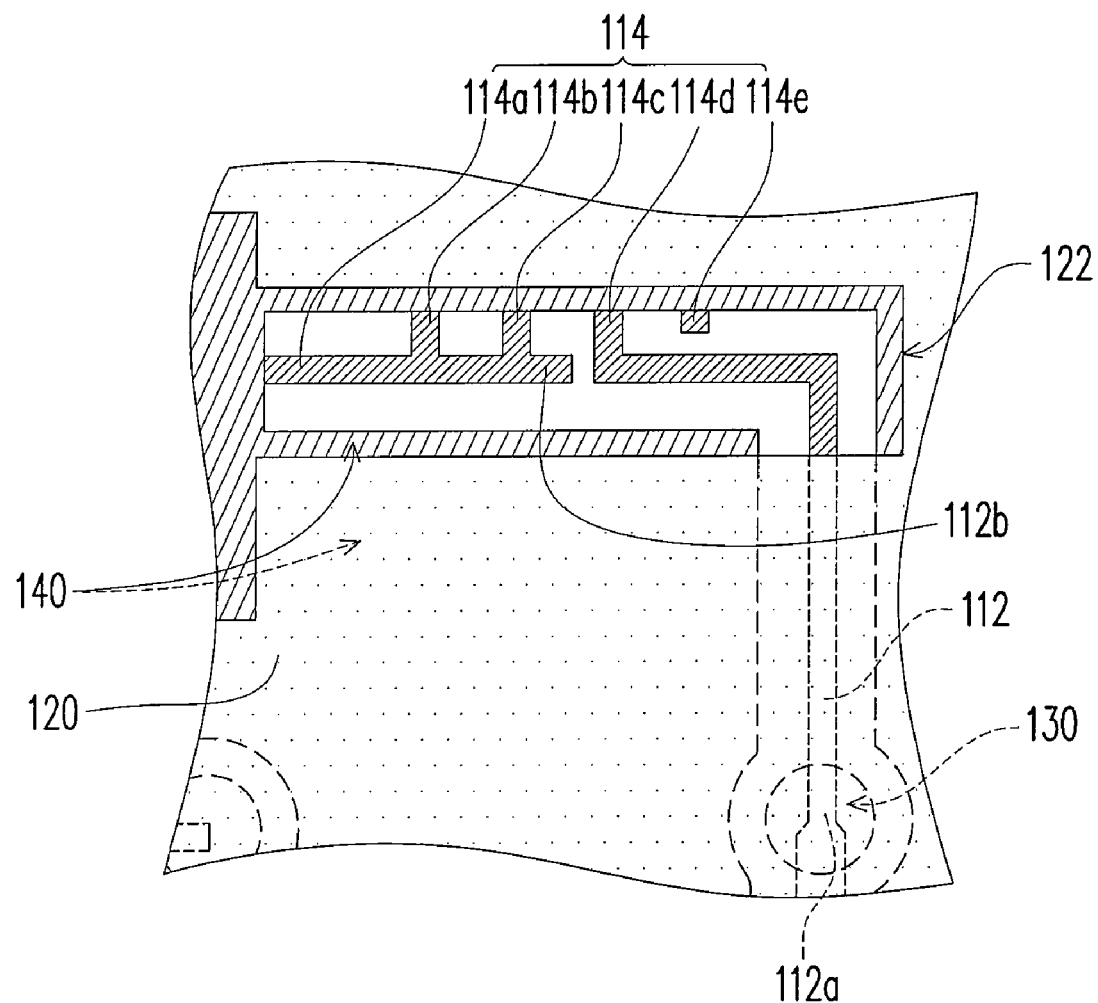
FIG. 1C is a schematic view depicting the circuit substrate in which the inductive circuit illustrated in FIG. 1B has been formed.
Figure 1D:
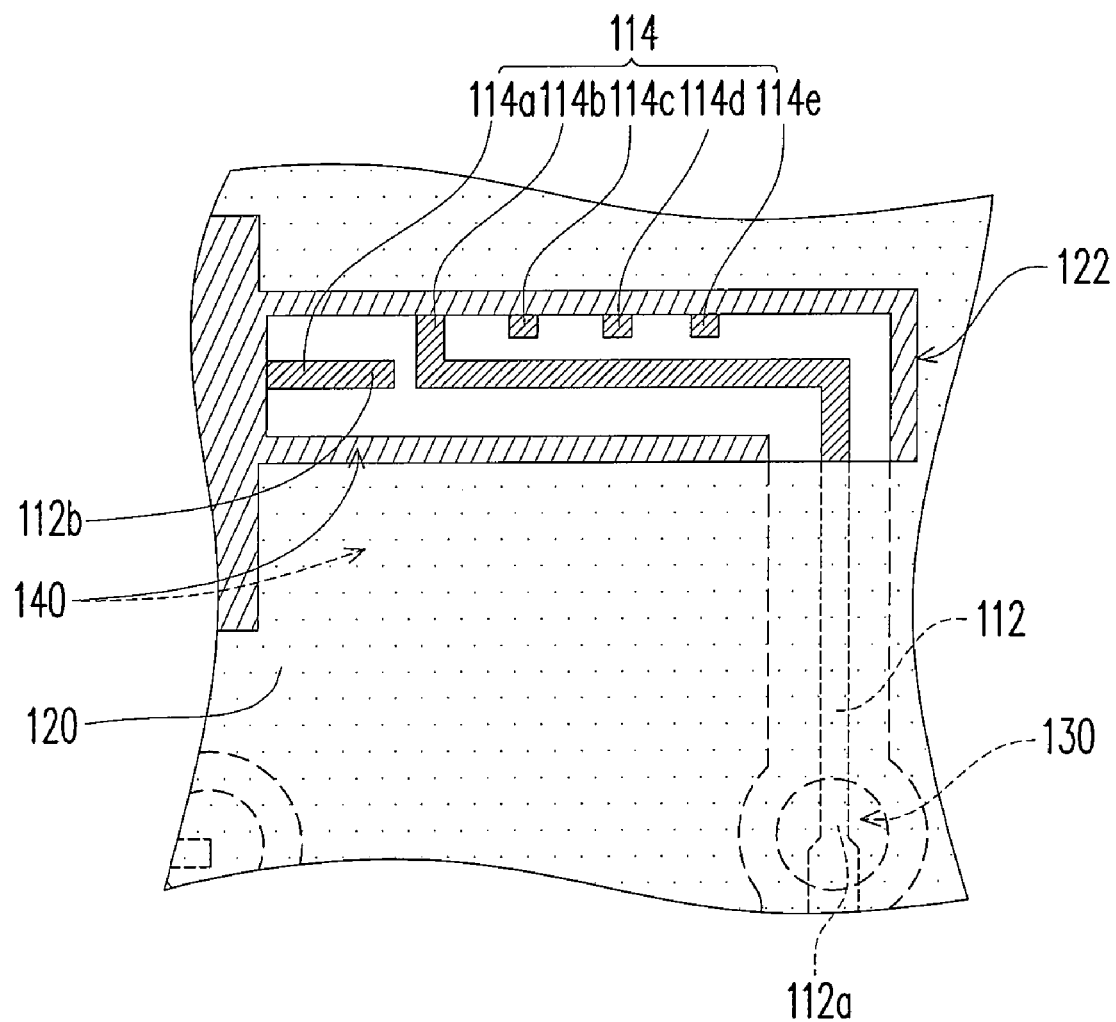
FIG. 1D is a schematic view depicting another circuit substrate in which the inductive circuit illustrated in FIG. 1B has been formed.
Figure 1E:
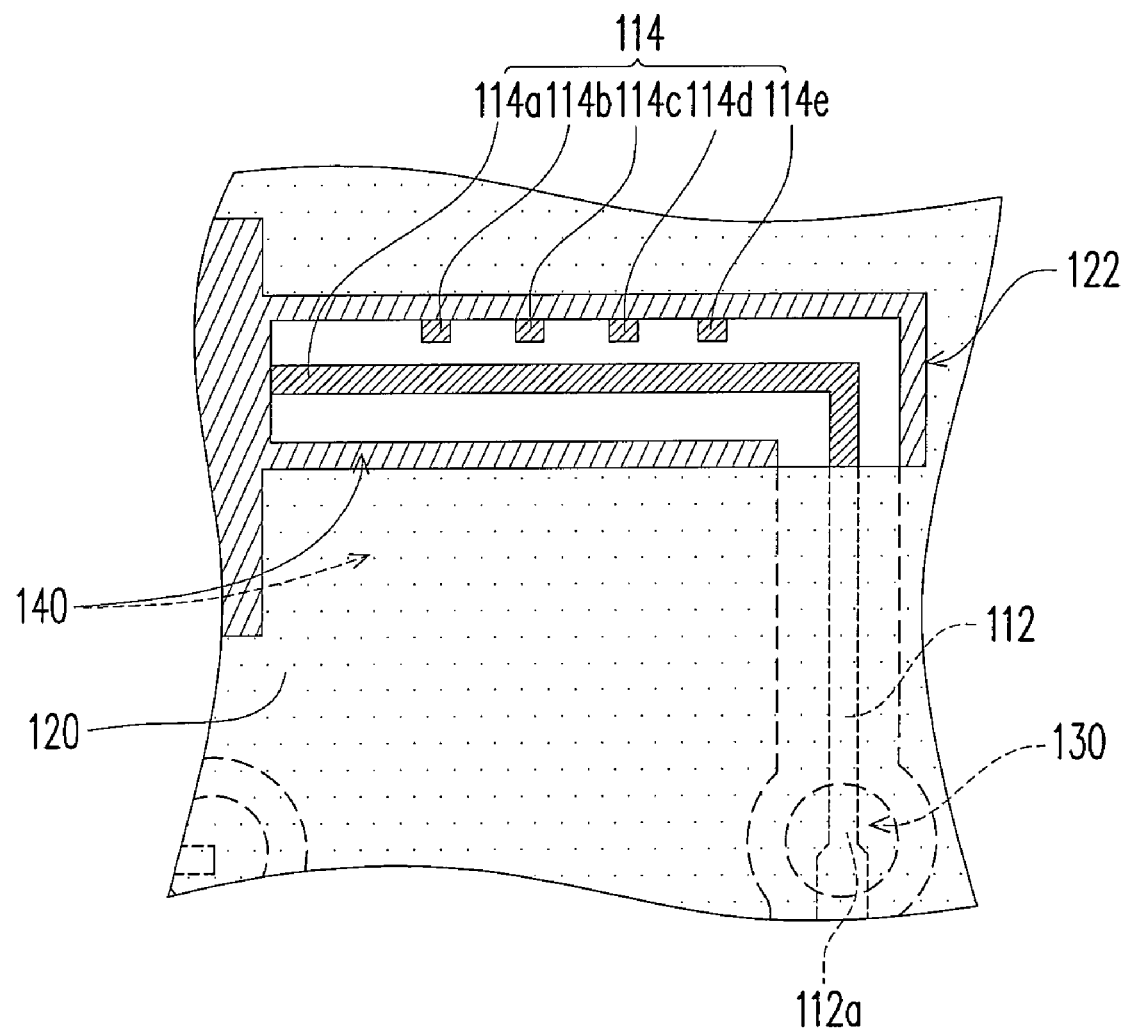
FIG. 1E is a schematic view depicting still another circuit substrate in which the inductive circuit illustrated in FIG. 1B has been formed.

FIG. 1A is a schematic view depicting a circuit substrate in which an inductive circuit has not yet been formed according to a first embodiment of the present invention. FIG. 1B is a schematic view depicting a portion of the view provided in FIG. 1A. FIG. 1C is a schematic view depicting the circuit substrate in which the inductive circuit illustrated in FIG. 1B has been formed. FIG. 1D is a schematic view depicting another circuit substrate in which the inductive circuit illustrated in FIG. 1B has been formed. FIG. 1E is a schematic view depicting still another circuit substrate in which the inductive circuit illustrated in FIG. 1B has been formed.

Referring to FIGS. 1A and 1B, the circuit substrate includes a laminated layer 102, an embedded electronic device 104, at least a circuit structure 110, and a solder mask layer 120. The laminated layer 102 includes a plurality of dielectric layers and at least a conductive layer that is interposed between the two adjacent dielectric layers. The embedded electronic device 104 is disposed within the laminated layer 102. The circuit structure 110 is disposed on a surface of the laminated layer 102 and includes a main line 112 and a plurality of branch lines 114. The main line 112 has a first terminal 112a and a second terminal 112b. In the present embodiment, the first terminal 112a can be connected to the embedded electronic device 104 through a plated through hole 130, while the second terminal 112b can be connected to a reference plane 140 through the respective branch lines 114. Here, the reference plane 140 is, for example, a ground plane. The branch lines 114 in the present embodiment are referred to as a branch line 114a, a branch line 114b, a branch line 114c, a branch line 114d, and a branch line 114e so as to clearly define the present invention. In other embodiments, however, the first terminal is connected to the reference plane, while the second terminal is connected to the embedded electronic device 104 through the respective branch lines. The embedded electronic device 104 and the circuit structure 110 together form a filter. The solder mask layer 120 is disposed on the surface of the laminated layer 102 and includes an opening 122 for exposing the branch lines 114 in the circuit structure 110. The solder mask layer 120 further exposes a portion of the main line 112 connected to the branch lines 114.

Referring to FIG. 1C, the branch line 114d is selected from the branch lines 114 for dividing the main line 112 into a first portion and a second portion. The first portion is interposed between the branch line 114d and the first terminal 112a, while the second portion is interposed between the branch line 114d and the second terminal 112b. Next, the second portion of the main line 112 and the branch line 114d are disconnected, and the branch line 114e and the first portion of the main line 112 are disconnected as well, such that the branch line 114d and the first portion of the main line 112 together form the inductive circuit. As such, upon the actual demands, the length of the inductive circuit can be adjusted by disconnecting the second portion of the main line 112 and one of the selected branch lines 114 and disconnecting the other branch lines 114 and the first portion of the main line 112. The method of disconnecting the main line 112 and the branch lines 114 includes performing a laser cutting process on the main line 112 and the branch lines 114 through the opening 122 of the solder mask layer 120. Here, the main line 112 and the branch lines 114 are exposed by the opening 122.

In brief, the method for fabricating the inductive circuit of the present invention mainly rests in first selecting one branch line in the circuit structure and then disconnecting the selected branch line and the second portion of the main line while the other branch lines and the first portion of the main line are also disconnected. Thereby, the selected branch line and the first portion of the main line can together form the inductive circuit.

In other embodiments of the present invention, the branch line 114b or the branch line 114a can also be selected for performing the aforesaid steps, such that the circuit structure respectively depicted in FIGS. 1D and 1E can be formed. It is of certainty that the branch line 114c or the branch line 114e can also be selected in other embodiments that are not depicted in the present invention. With reference to the above descriptions, people skilled in the pertinent art are likely to determine a position at which the circuit is cut based on the actual circuit layout. In addition, the aforesaid embodiments are mere examples of the circuit structure and hence the embodiments should by no means limit the scope of the present invention. In view of the foregoing, it is intended that modifications and variations of fabricating the above-mentioned circuit structure can be made by people skilled in the pertinent art based on the actual demands provided that they fall within the scope of the claims and their equivalents.

Second Embodiment

Figure 2A:
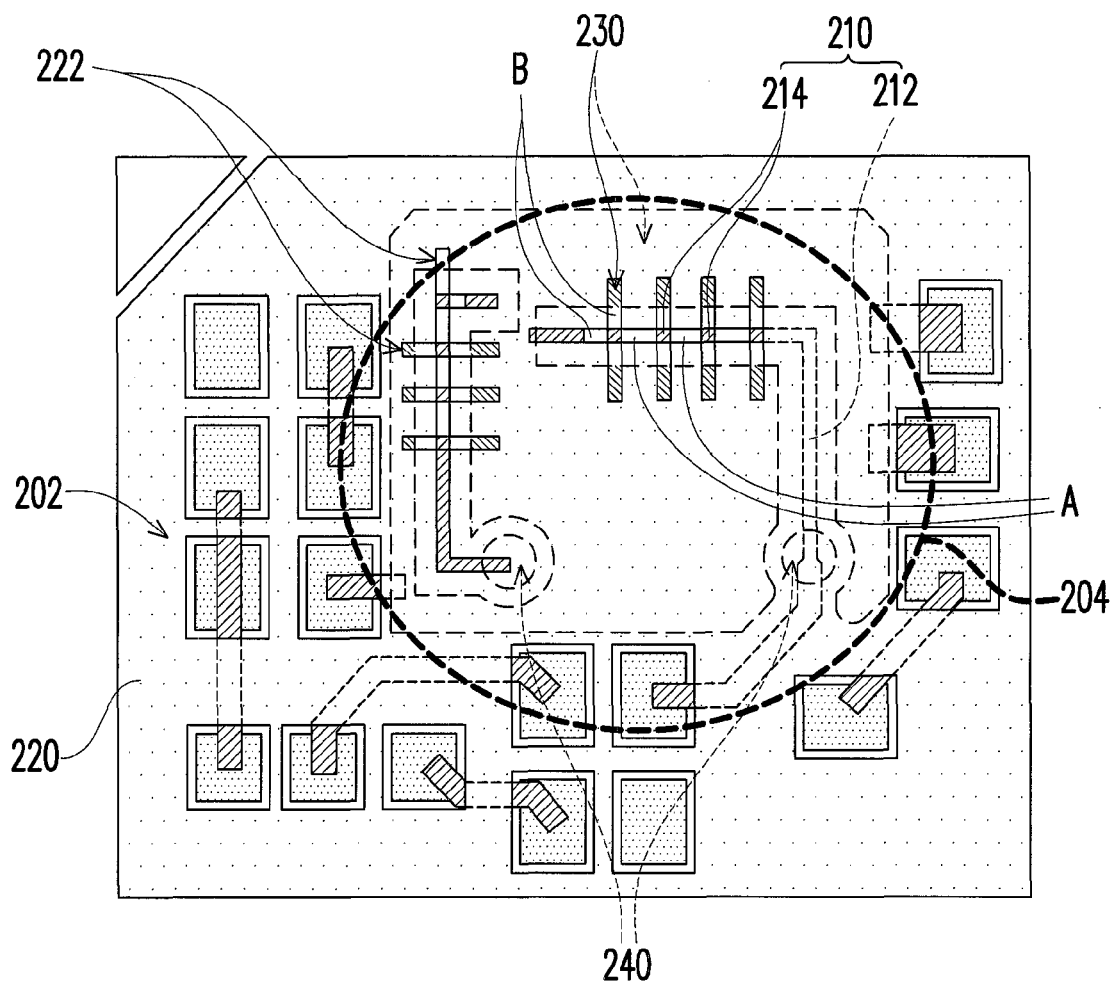
FIG. 2A is a schematic view depicting a circuit substrate in which an inductive circuit has not yet been formed according to a second embodiment of the present invention.
Figure 2B:
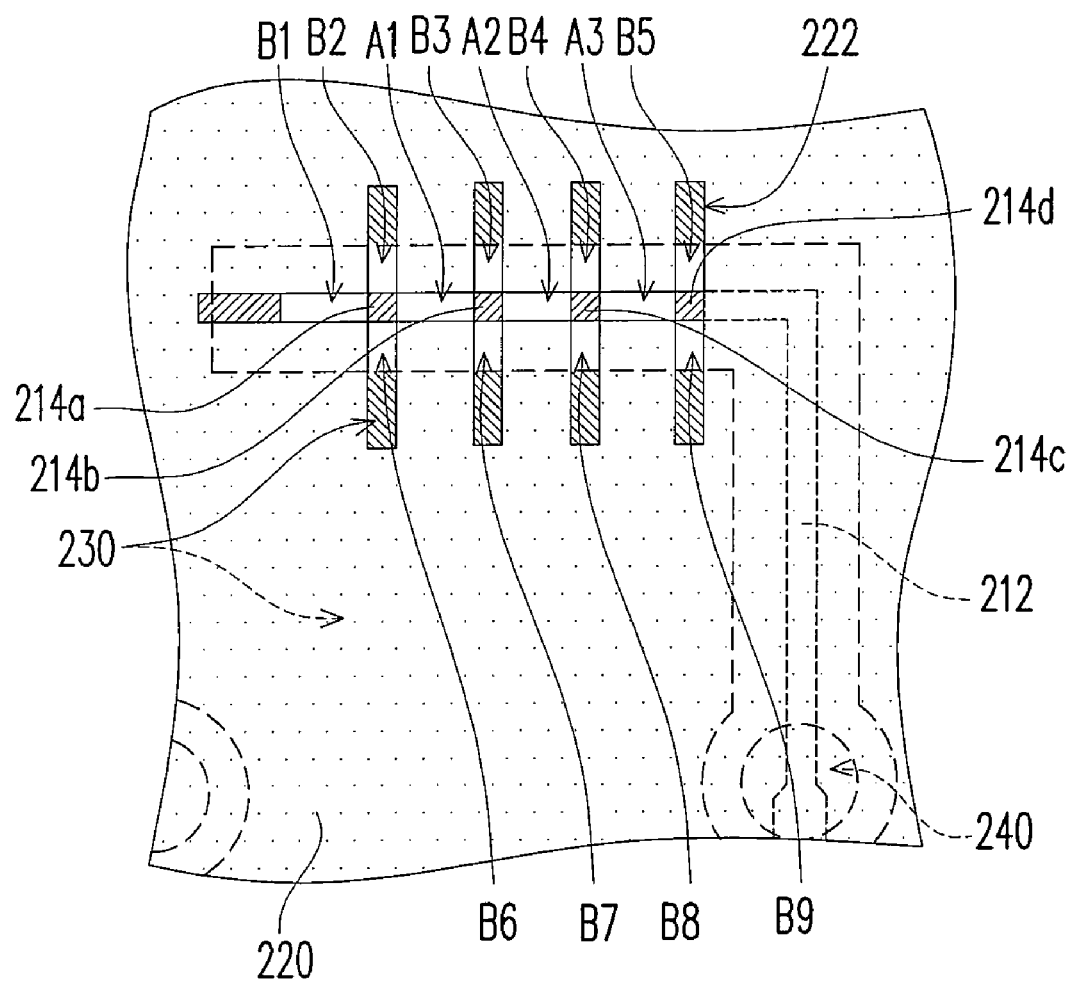
FIG. 2B is a schematic view depicting a portion of the view provided in FIG. 2A.
Figure 2C:
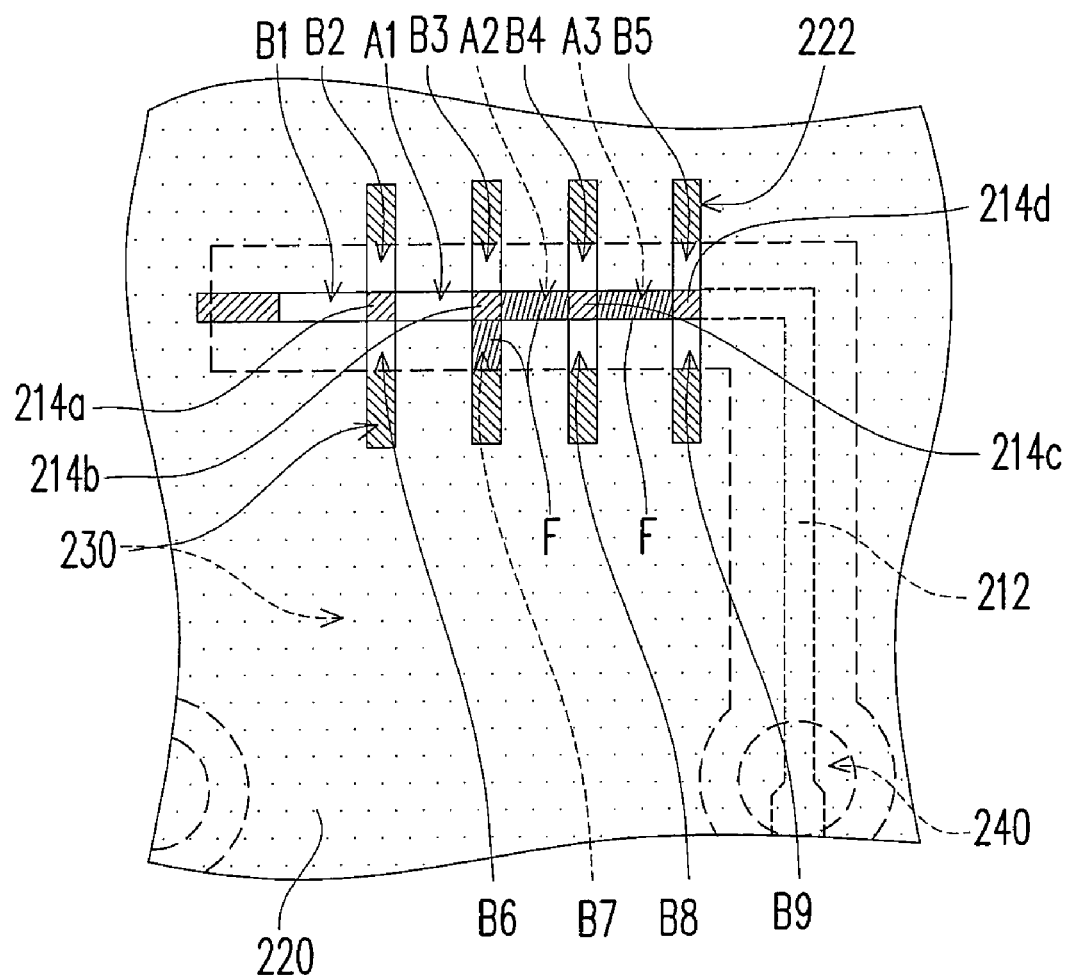
FIG. 2C is a schematic view depicting the circuit substrate in which the inductive circuit illustrated in FIG. 2B has been formed.
Figure 2D:
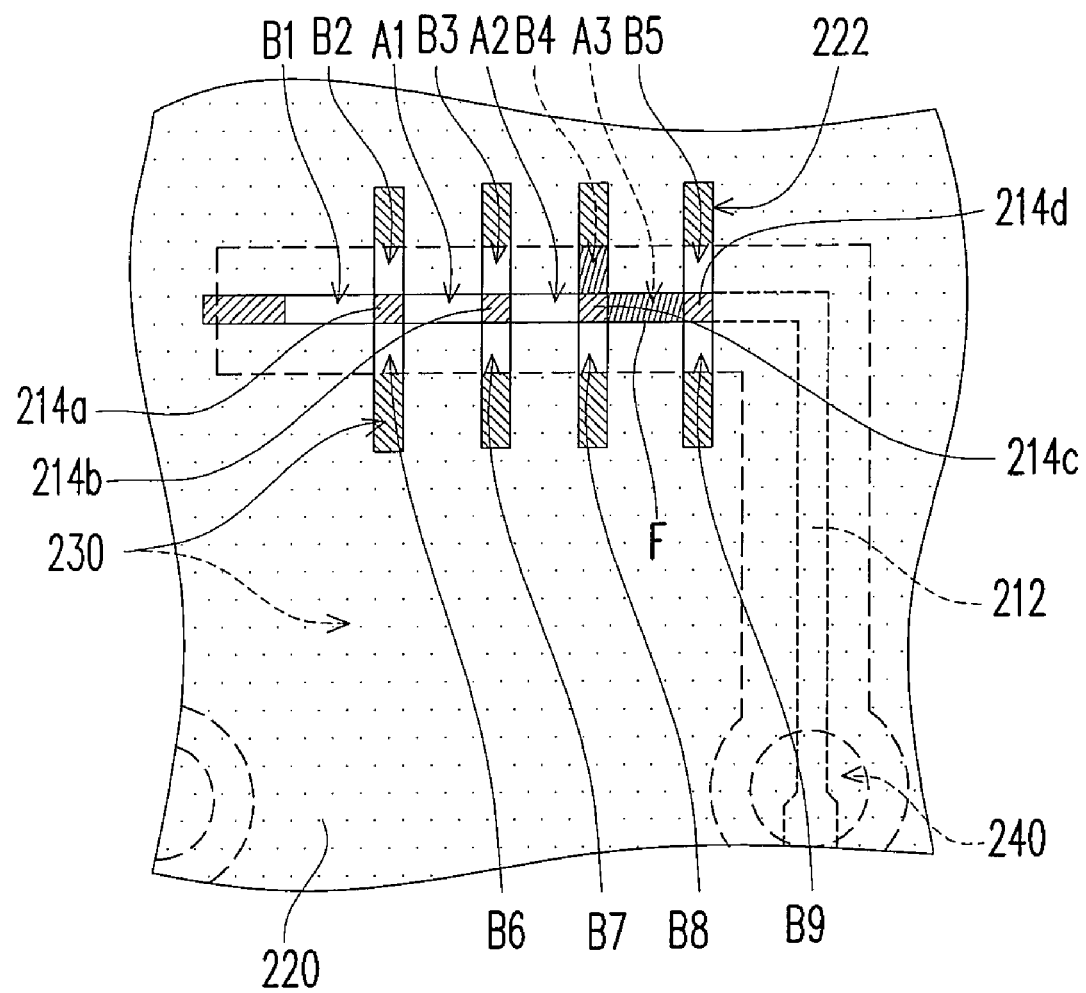
FIG. 2D is a schematic view depicting another circuit substrate in which the inductive circuit illustrated in FIG. 2B has been formed.
Figure 2E:
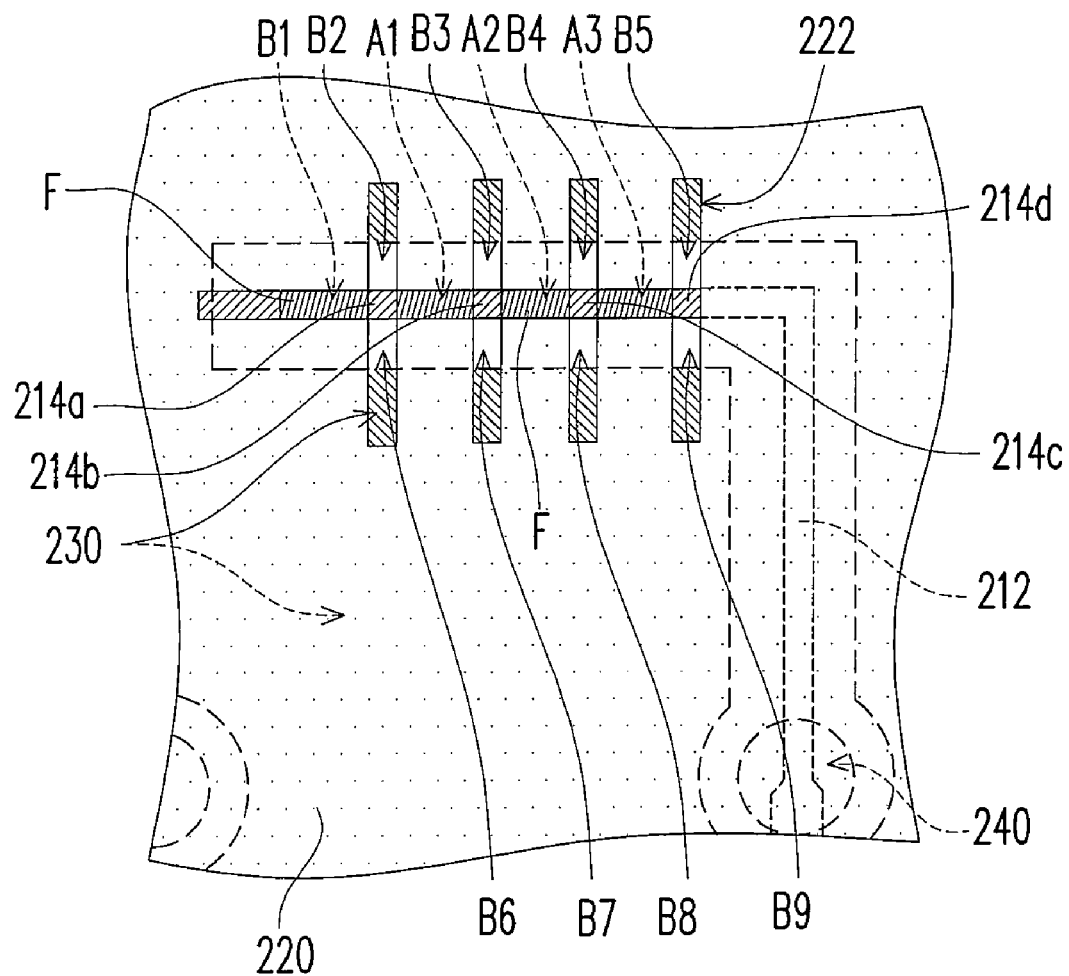
FIG. 2E is a schematic view depicting still another circuit substrate in which the inductive circuit illustrated in FIG. 2B has been formed.

FIG. 2A is a schematic view depicting a circuit substrate in which an inductive circuit has not yet been formed according to a second embodiment of the present invention. FIG. 2B is a schematic view depicting a portion of the view provided in FIG. 2A. FIG. 2C is a schematic view depicting the circuit substrate in which the inductive circuit illustrated in FIG. 2B has been formed. FIG. 2D is a schematic view depicting another circuit substrate in which the inductive circuit illustrated in FIG. 2B has been formed. FIG. 2E is a schematic view depicting still another circuit substrate in which the inductive circuit illustrated in FIG. 2B has been formed.

Referring to FIGS. 2A and 2B, the circuit substrate includes a laminated layer 202, an embedded electronic device 204, at least a circuit structure 210, and a solder mask layer 220. The laminated layer 202 includes a plurality of dielectric layers and at least a conductive layer that is interposed between the two adjacent dielectric layers. The embedded electronic device 204 is disposed within the laminated layer 202. The circuit structure 210 is disposed on a surface of the laminated layer 202 and includes a main line 212 and a plurality of circuit traces 214. The circuit traces 214 in the present embodiment are referred to as a circuit trace 214a, a circuit trace 214b, a circuit trace 214c, and a circuit trace 214d so as to clearly define the present invention. The main line 212 and the circuit traces 214 are arranged along a trace direction extending from the embedded electronic device 204 to a reference plane 230. The reference plane 230 can be a ground plane. In the present embodiment, the main line 212 can be connected to the embedded electronic device 204 through a plated through hole 240. There exists a first blank area A between the two adjacent circuit traces 214, while there exists a second blank area B between each of the circuit traces 214 and the corresponding reference plane 230. The first blank areas A in the present embodiment are classified into a first blank area A1, a first blank area A2, and a first blank area A3 so as to clearly define the present invention. Likewise, the second blank areas B are classified into a second blank area B1, a second blank area B2, a second blank area B3, a second blank area B4, a second blank area B5, a second blank area B6, a second blank area B7, a second blank area B8, and a second blank area B9. In other embodiments, however, the main line is connected to the reference plane. The first blank area is interposed between the two adjacent circuit traces, while the second blank area is interposed between each of the circuit traces and the corresponding embedded electronic device 204. The embedded electronic device 204 and the circuit structure 210 together form a filter. The solder mask layer 220 is disposed on the surface of the laminated layer 202 and includes an opening 222 at least exposing the first blank areas A and the second blank areas B. The opening 222 further exposes the circuit traces 214.

Referring to FIG. 2C, the circuit trace 214b is selected from the circuit traces 214. Next, the second blank area B7 corresponding to the circuit trace 214b is conducted, and the first blank areas A2 and A3 between the circuit trace 214b and the main line 212 are conducted, such that the circuit trace 214b, the main line 212, and the circuit traces 214c and 214d interposed between the circuit trace 214b and the main line 212 together form an inductive circuit. As such, upon the actual demands, the length of the inductive circuit can be adjusted by conducting the second blank area B corresponding to the selected circuit trace 214 and conducting the first blank areas A interposed between the selected circuit trace 214 and the main line 212. The method of conducting the first blank areas A and the second blank areas B may include filling the first blank areas A and the second blank areas B with a conductive material F through the opening 222 of the solder mask layer 220. Here, the conductive material F can be a solder material.

In brief, the method for fabricating the inductive circuit of the present invention mainly rests in first selecting one circuit trace of the circuit structure and then conducting the second blank area corresponding to the selected circuit trace while the first blank areas interposed between the selected circuit trace and the main line are also conducted. As such, the selected circuit trace, the main line, and the other circuit traces interposed between the selected circuit trace and the main line together form the inductive circuit.

In other embodiments of the present invention, the circuit trace 214c or the circuit trace 214a can also be selected for performing the aforesaid steps, such that the circuit structure respectively depicted in FIGS. 2D and 2E can be formed. It is of certainty that the circuit trace 214d can also be selected in other embodiments that are not depicted in the present invention. With reference to the above descriptions, people skilled in the pertinent art are likely to determine a position at which the circuit trace is conducted based on the actual circuit layout. In addition, the aforesaid embodiments are mere examples of the circuit structure and hence the embodiments should by no means limit the scope of the present invention. In view of the foregoing, it is intended that modifications and variations of fabricating the above-mentioned circuit structure can be made by people skilled in the pertinent art based on actual demands provided that they fall within the scope of the claims and their equivalents.

To sum up, in the circuit substrate of the present invention and the method for fabricating the inductive circuit, the length of the circuit in the circuit substrate can be adjusted by connecting or disconnecting the circuit structure upon the actual demands. As the present invention is applied to the embedded electronic device in the SIP structure, there is a likelihood of adjusting the length of the circuit. For instance, since the inductance can be adjusted by adjusting the length of the inductive circuit upon the actual demands in the present invention, the frequency shift arisen from the embedded BPF can be rectified by applying the present invention, and thereby the band-pass effect can be improved. As such, the performance and yield of the SIP products can be increased. Moreover, the application of the present invention can also be conducive to adjusting the resistance or adjusting the length of other circuits.

Although the present invention has been disclosed above by the embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A circuit substrate, comprising:
   a laminated layer;
   an embedded electronic device disposed within the laminated layer;
   at least a circuit structure disposed on a surface of the laminated layer, the at least a circuit structure comprising a main line and a plurality of branch lines, wherein the main line has a first terminal and a second terminal, the first terminal is connected to one of a reference plane and the embedded electronic device, and the second terminal is connected to the other of the reference plane and the embedded electronic device through the plurality of branch lines; and
   a solder mask layer disposed on the surface of the laminated layer, the solder mask layer comprising an opening for exposing the plurality of branch lines in the at least a circuit structure.

2. The circuit substrate as claimed in claim 1, wherein the solder mask layer further exposes a portion of the main line connected to the plurality of branch lines.

3. The circuit substrate as claimed in claim 1, wherein the laminated layer comprises a plurality of dielectric layers and at least a conductive layer that is interposed between two adjacent dielectric layers of the plurality of dielectric layers.

4. The circuit substrate as claimed in claim 1, wherein the reference plane is a ground plane.

5. The circuit substrate as claimed in claim 1, wherein the embedded electronic device and the at least a circuit structure together form a filter.

6. A method for fabricating an inductive circuit, the method being adapted to a circuit substrate which comprises:
   a laminated layer;
   an embedded electronic device formed within the laminated layer;
   at least a circuit structure disposed on a surface of the laminated layer, the at least a circuit structure comprising a main line and a plurality of branch lines, wherein the main line has a first terminal and a second terminal, the first terminal is connected to one of a reference plane and the embedded electronic device, and the second terminal is connected to the other of the reference plane and the embedded electronic device through the plurality of branch lines; and
   a solder mask layer disposed on the surface of the laminated layer, the solder mask layer comprising an opening for exposing the plurality of branch lines in the at least a circuit structure,
   the method for fabricating the inductive circuit comprising:
   selecting one of the plurality of branch lines to divide the main line into a first portion and a second portion, wherein the first portion is interposed between the selected one of the plurality of branch lines and the first terminal, and the second portion is interposed between the selected one of the plurality of branch lines and the second terminal; and
   disconnecting the second portion of the main line and the selected one of the plurality of branch lines and disconnecting the selected one of the plurality of branch lines and the first portion of the main line, such that the selected one of the plurality of branch lines and the first portion of the main line together form the inductive circuit.

7. The circuit substrate as claimed in claim 6, wherein the solder mask layer further exposes the first portion and the second portion of the main line connected to the plurality of branch lines.

8. The method for fabricating the inductive circuit as claimed in claim 6, wherein the reference plane is a ground plane.

9. The method for fabricating the inductive circuit as claimed in claim 6, wherein the laminated layer comprises a plurality of dielectric layers and at least a conductive layer that is interposed between two adjacent dielectric layers of the plurality of dielectric layers.

10. The method for fabricating the inductive circuit as claimed in claim 6, wherein the embedded electronic device and the at least a circuit structure together form a filter.

11. The method for fabricating the inductive circuit as claimed in claim 6, wherein the method of disconnecting the second portion of the main line and the selected one of plurality of branch lines comprises performing a laser cutting process between the second portion of the main line and the selected one of plurality of branch lines through the opening of the solder mask layer,
   wherein the method of disconnecting the selected one of the plurality of branch lines and the first portion of the main line comprises performing a laser cutting process between the selected one of the plurality of branch lines and the first portion of the main line through the opening of the solder mask layer, and
   wherein the first portion and the second portion of the main line and the selected one of the plurality of branch lines are exposed by said opening of the solder mask layer.

* * * * *